United States Patent [19]
Keleher et al.

[11] Patent Number: 5,736,861
[45] Date of Patent: Apr. 7, 1998

[54] CIRCUIT BREAKER TESTER

[75] Inventors: Paul A. Keleher, 35 Barnes Rd., Berlin, Mass. 01503; Charles D. O'Neal, III, Bolton, Mass.

[73] Assignee: Paul A. Keleher, Berlin, Mass.

[21] Appl. No.: 691,692

[22] Filed: Aug. 2, 1996

Related U.S. Application Data

[60] Provisional application No. 60/001,960 Aug. 7, 1995.

[51] Int. Cl.[6] ................................................ G01R 31/32
[52] U.S. Cl. .................................... 324/424; 324/537
[58] Field of Search ............................ 340/638; 324/424, 324/537, 550, 73.1

[56] References Cited

U.S. PATENT DOCUMENTS

| | | |
|---|---|---|
| 2,230,730 | 2/1941 | Skeats . |
| 2,819,445 | 1/1958 | Were . |
| 3,532,967 | 10/1970 | Milton ........................ 324/424 |
| 3,604,976 | 9/1971 | Zajk . |
| 3,646,438 | 2/1972 | Staff . |
| 3,678,372 | 7/1972 | Elder . |
| 4,105,965 | 8/1978 | Russell . |
| 4,157,496 | 6/1979 | St-Jean . |
| 4,209,739 | 6/1980 | Paice . |
| 4,351,013 | 9/1982 | Matsko et al. . |
| 4,433,292 | 2/1984 | Aoyagi et al. . |
| 4,454,476 | 6/1984 | Kobayashi et al. . |
| 4,870,532 | 9/1989 | Beatty, Jr. et al. . |
| 4,873,603 | 10/1989 | Ishii ........................... 324/424 |
| 5,270,658 | 12/1993 | Epstein ........................ 324/424 |
| 5,272,438 | 12/1993 | Stumme ....................... 324/424 |

Primary Examiner—Ernest F. Karlsen
Assistant Examiner—Jose M. Solis
Attorney, Agent, or Firm—Ohlandt, Greeley, Ruggiero & Perle

[57] ABSTRACT

A circuit breaker tripper includes a first charging circuit for charging an RC shorting time control circuit. A relay is connected to a pair of probes that are connected to an active line which enables a charging of the RC shorting time control circuit. Activation of a switch causes a relay to apply a short circuit across the active line, thereby causing a tripping of the circuit breaker. At the same time, a discharge circuit is activated which causes the relay open the short circuit after a preset period. Since the circuit breaker tripper relies on enabling sufficient current flow through the circuit breaker to trip it, a test circuit is provided which enables operation of the tripper only if the branch circuit is within a safe operating range for the circuit breaker tripper.

8 Claims, 2 Drawing Sheets

CIRCUIT BREAKER TESTER

This Application claims priority benefits under 35 USC 111(b) from United States Provisional Application 60/001960, filed Aug. 7, 1995.

FIELD OF THE INVENTION

This invention relates to circuit breaker trippers and more particularly, to a hand-held circuit breaker tripper for safely and remotely causing activation of a breaker.

BACKGROUND OF THE INVENTION

The inability to safely and conveniently de-energize a 120 volt AC circuit from the outlet is a major problem for the electrician. Generally, the electrician is required to take the time to find the main electrical distribution box and to throw the breaker to deenergize a circuit. If time does not permit such action, such as in a large building, the electrician may either work on the circuit in the "hot" state or purposely short the outlet to cause the breaker to open the circuit. However many circuits do not operate within safe tolerances and the uncontrolled shorting of the circuit is hazardous, at best. For instance, if the short circuit is created by touching a hot lead to a grounded metal part of the box or enclosure, flying hot metal, blinding flashes and possibly shock can occur.

Some branch circuits may have an excess of resistance due to long runs or defective connections. Such extra resistance may keep a short circuit current flow low enough so that a breaker will not be activated. Further, some branch circuits may exhibit so little resistance as to allow an excessive amount of short circuit current to flow, potentially causing damage.

The prior art includes various devices for the testing of circuit breakers, all of which require direct access to the breaker. Puckett et al., in U.S. Pat. No. 4,998,067, describe a test apparatus for a circuit breaker which enables the breaker to be tested under various load conditions. One such condition is a short circuit condition wherein the breaker has a direct short placed across it at the distribution box to determine if it will open. If the breaker is slow in operation, the only damage is at the distribution box and not in the internal wall wiring (with a possible fire risk).

U.S. Pat. No. 3,532,967 to Milton describes a circuit breaker tester which includes an SCR in series with a current limiting resistance element. The testing of the circuit breaker requires gaining access to the circuit breaker, disconnecting a wire and applying test currents thereto.

Accordingly, it is an object of the invention to provide a circuit breaker tripper which does not require physical access to the breaker.

It is a further object of the invention to provide a circuit breaker tripper which can be used to safely trip a circuit breaker without creating a fire danger.

It is another object of the invention to provide a circuit breaker tripper which is rendered inoperative if an unsafe circuit condition exists and warns the user of the unsafe condition.

SUMMARY OF THE INVENTION

A circuit breaker tripper includes a first charging circuit for charging an RC shorting time control circuit. A relay is connected to an active line which enables a charging of the RC shorting time control circuit. Activation of a switch causes a relay to apply a short circuit across the active line, thereby causing a tripping of the circuit breaker. At the same time, a discharge circuit is activated which causes the relay open the short circuit after a preset period. Since the circuit breaker tripper relies on enabling sufficient current flow through the circuit breaker to trip it, a test circuit is provided which enables operation of the tripper only if the branch circuit is within a safe operating range for the circuit breaker tripper.

DETAILED DESCRIPTION OF THE PREFERRED EMBODIMENT

Figure 1:
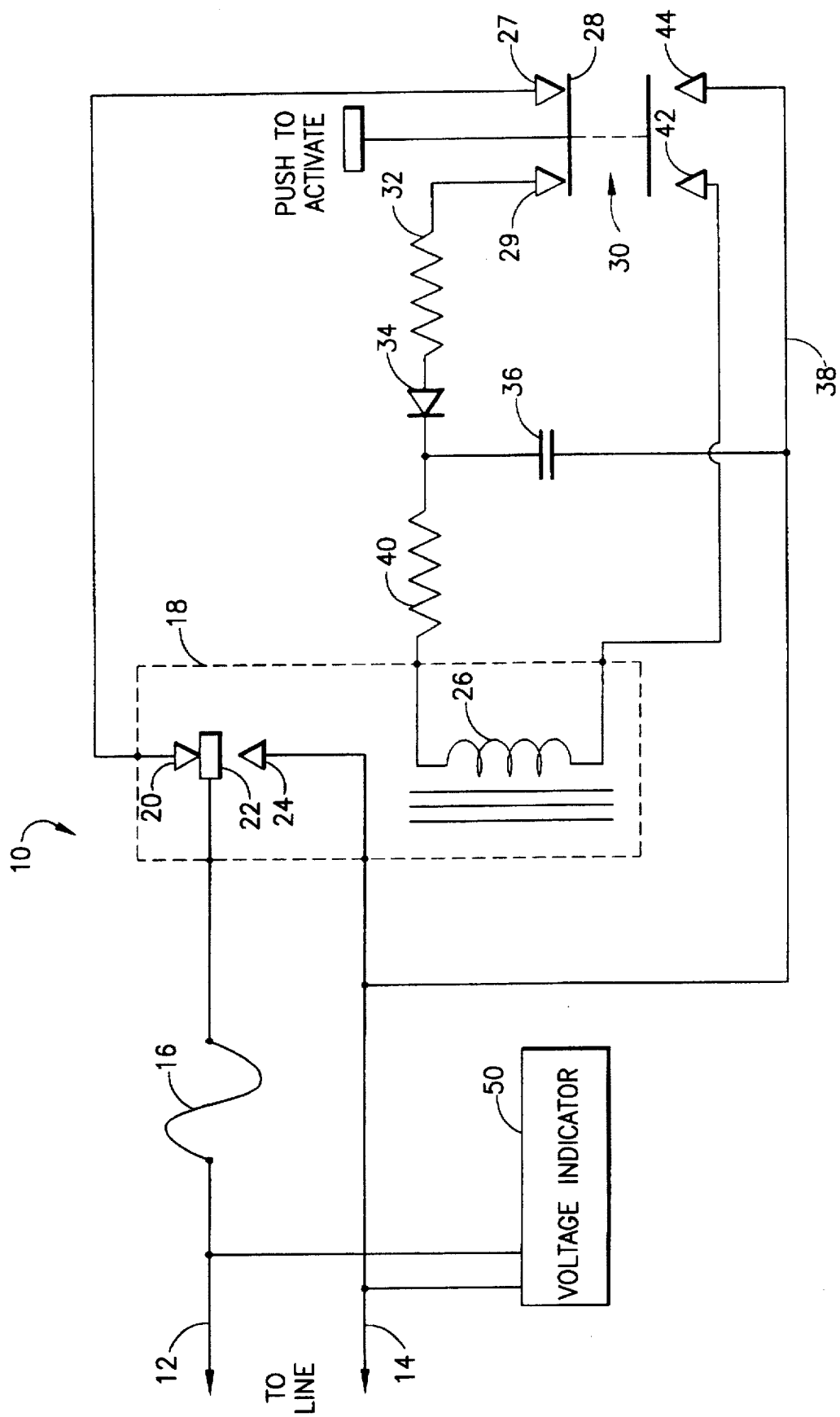
FIG. 1 illustrates a circuit embodying the invention.

Referring to FIG. 1, tester 10 includes probes 12 and 14 are connected by the electrician across an active circuit to be de-energized. The active circuit is normally a 117 volt AC circuit protected by a 15 or 20 amp circuit breaker.

Fuse 16 is a high current, quick blow, 1000 amp rated device which protects the branch circuit from excess heating should a fault occur in tester 10. Fuse 16 is selected to have a characteristic that will not allow it to blow under the range of conditions normally found in typical branch circuits that are shorted for two seconds or less. Such fuses are commercially available.

Fuse 16 is connected to normally closed contacts 20 and 22 of a relay 18. Contact 22 travels between normally closed contact 20 and normally open contact 24 under control of solenoid 26. Normally closed contact 20 is connected via contact 27, armature 28 and contact 29 of a push-to-activate switch 30, to resistor 32, diode 34, capacitor 36, common line 38 to probe 14. A resistor 40 connects diode 34 to one side of solenoid 25. The other side of coil 26 is connected to contact 42 of switch 30. When switch 30 is activated, contact 42 is connected to contact 44 and common line 38 by armature 28. At the same time, the connection between contacts 27 and 29 is broken.

A voltage indicator 50 is connected between probes 12 and 14 and shows the user when the circuit is deactivated as well as providing a voltage line measurement. It is placed on the line side of fuse 16 for safety in case the circuit is still live, even if fuse 16 has blown. A neon bulb may be used if voltage measurements are not required.

When probes 12 and 14 are inserted into an active outlet, current flows through push-to-activate switch 30, resistor 32, diode 34 and charges capacitor to the peak line voltage. Diode 34 provides rectified current to capacitor 36, with the charging time controlled by the values of capacitor 36 and resistor 32. The charge time is preferably set sufficiently long so as to limit the number of times a minute the user can repeatedly short a line (for safety reasons).

When capacitor 36 is charged, the user activates a breaker trip action by pushing switch 30 and causing contacts 42 and 44 to be shorted. Capacitor 36 then discharges through resistor 40, solenoid 26, contacts 42,44 to common line 38. The resulting current flow through solenoid 26 causes contact 22 to move to contact 24, placing a direct short across probes 12 and 14. This action draws sufficient current to trip a breaker connected to probes 12 and 14.

The time during which solenoid 26 maintains the connection between contacts 22 and 24 is controlled by the values of capacitor 36, resistor 40 and the resistance of solenoid 26. That time is preferably set to a value between 0.1 to 10 seconds.

Solenoid 26 maintains the connection between contacts 22 and 24 only if the user holds switch 30 in the closed position for a duration dependent upon the RC circuit discharge time. If the user opens switch 30 before the limit, solenoid 26 is deenergized and contact 22 is moved to contact 20. Once tester 10 is activated, the user must wait the charge time before a next breaker can be tripped.

Figure 2:
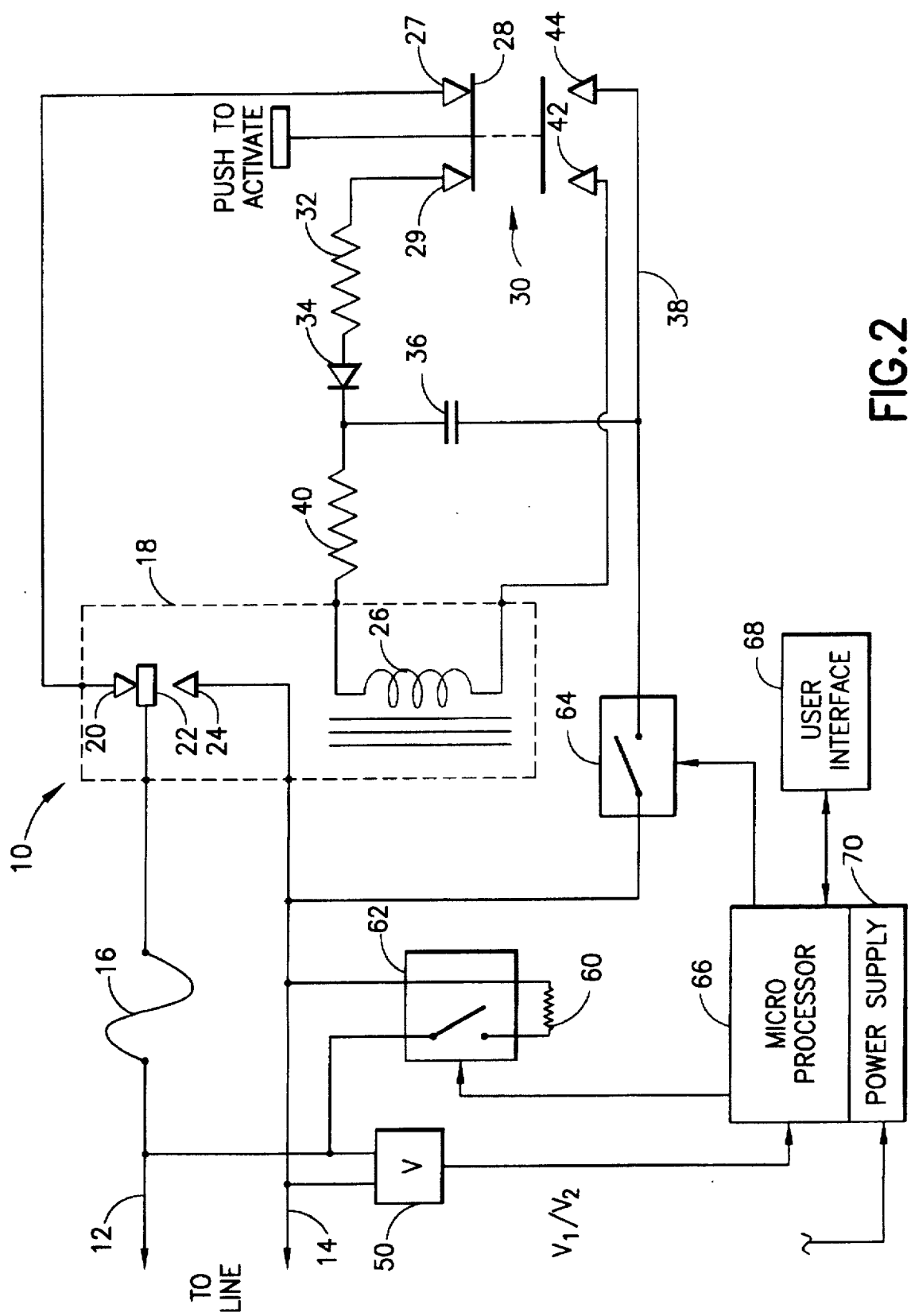
FIG. 2 illustrates a further embodiment of the invention.

Referring now to FIG. 2, a further embodiment of the invention is shown which prevents operation of tester 10 if the connected branch circuit is not within safe operating limits. The elements in FIG. 2 that are shown in FIG. 1 are numbered identically. In FIG. 2, a test resistor 60 is connected via a first switch 62 across conductors 12 and 14. Further, a second switch 64 is positioned in common line 38 and, when opened, prevents operation of the shorting action of tester 10. A microprocessor 66 is connected so as to control switches 62 and 64, in dependence upon voltage measurements detected by voltage indicator 50. Microprocessor 66 is further coupled to a user interface which enables a user to input operating commands and to receive indications of a safe or unsafe state of the branch circuit. A power supply 70 (e.g., a rechargeable battery) is provided to enable operation of microprocessor 66.

Before using tester 10 to deactivate a breaker, the branch circuit is characterized by measuring its performance under load and calculating the branch circuit resistance. This resistance measurement is saved and compared to safe operating limits stored in the memory of microprocessor 66. If the circuit resistance is determined to be within safe operating limits, the tripping function is enabled.

The resistance measurement is performed first before every circuit breaker deactivation. If the safe limits are not present on a particular branch circuit being deactivated, the user is alerted and the shorting circuit is disabled.

Microprocessor 66 measures the impedance of the branch circuit by placing a known load resistance 60 across the line and measuring the change in delivered voltage. In order to be useful, load resistance 60 must be a significant fraction of the maximum rated amperage of the circuit, typically at least 50%. Microprocessor 66 performs the resistance measurement as follows:

1) Switches 62 and 64 are opened and the open circuit line voltage is measured, i.e., V1;
2) Switch 62 is closed and resistor 60 (R1) is placed across the line;
3) Voltage V2 is measured across resistor 60 by voltage indicator 50;
4) The branch circuit resistance R2, is then calculated as follows:

$$R2=R1 \ (V1-V2)/V2$$

5) The value of R2 is saved and compared by microprocessor 66 to minimum and maximum branch circuit resistances which tester circuit 10 can safely and reliably deactivate.
6) If the R2 value is between the maximum and minimum acceptable limits, then microprocessor 64 closes switch 64 and circuit tripping is enabled.

The maximum and minimum operable branch resistances can be derived from maximum and minimum currents which can be tolerated in the branch circuit. For example if 800 A max, is desired, the calculation is as follows:

800 Amperes=120 Volts/R
R=0.15 Ohms, represents the minimum branch circuit resistance The same calculation is used to determine the maximum resistance for the minimum current flow. This limit is determined by the breaker characteristics, in that a certain multiple of the breaker's current rating must flow to trip it within the activation time of tester 10. For example, a 15 Amp breaker that needs 10 times its rated current to trip in 2 seconds would require 150 Amps of branch current. At 120 volts this would require a maximum branch circuit resistance of:

150 Amperes=120 Volts/R
R=120/150
R=0.8 Ohms, the maximum branch circuit resistance.

Tester 10 allows the user to activate a test (i.e., with switch 64 closed) only if the branch resistance is lower than the maximum resistance value.

The circuits of FIGS. 1 and 2 represent only examples of a plurality of ways the individual functions can be accomplished. For example, relay 18 can be a solid state device capable of handling high currents. Charge and discharge timing can also be controlled by a solid state circuitry or a microprocessor. Relay 18 can also be designed to switch in resistor 60 for the circuit performance measurement. Further, while push-to-activate switch 30 is shown as independently operable, the circuit may be designed so that switch 30 is automatically operated by an input from microprocessor 66 after the branch circuit resistances are found to be within acceptable limits.

Accordingly, the invention hereof is to be limited only by the claims which follow.

We claim:

1. A circuit breaker test device for connection to a branch circuit including a circuit breaker, comprising:
   first switch means for controllably short circuiting said branch circuit;
   control means for causing said first switch means to short circuit said branch circuit;
   timer means responsive to operation of said control means, for causing said first switch means to cease short circuiting said branch circuit; and
   test means for determining an impedance value of said branch circuit and enabling operation of said control means only if said impedance value is within predetermined limits.

2. The circuit breaker test device as recited in claim 1, wherein said test means connects a known resistance across said branch circuit and employs a current flow therethrough to enable determination of said impedance value.

3. The circuit breaker test device as recited in claim 2, wherein said test means compares said impedance value to a minimum allowable branch circuit resistance value and a maximum allowable branch circuit resistance value and if said impedance value is therebetween enables said operation of said control means.

4. The circuit breaker test device as recited in claim 1, wherein said timer means comprises a resistance-capacitance circuit which receives power from said branch circuit to charge said capacitance prior to operation of said control means.

5. The circuit breaker test device as recited in claim 4, wherein said capacitance is caused to discharge through said resistance upon operation of said control means.

6. The circuit breaker test device as recited in claim 5, wherein said control means comprises a switch connected to said branch circuit and a relay which includes contacts that short said branch circuit upon operation of said relay, said resistance-capacitance circuit connected between said switch and said relay, whereby operation of said switch causes said contacts to short said branch circuit and enables discharge of said capacitance through said relay to open said contacts and to terminate short circuit current flow from said branch circuit in a time period determined by a discharge characteristic of said resistance capacitance circuit.

7. The circuit breaker test device as recited in claim 4, wherein said resistance-capacitance circuit charge time is sufficiently long to prevent immediately succeeding operations of said device.

8. The circuit breaker test device as recited in claim 1, wherein said test means comprises a microprocessor which determines an approximate open circuit voltage of said branch circuit and a current flow through a test resistor to determine said impedance value.

\* \* \* \* \*